United States Patent
Tanaka et al.

(10) Patent No.: US 7,927,985 B2
(45) Date of Patent: Apr. 19, 2011

(54) METHOD OF MANUFACTURING SEMICONDUCTOR DEVICES

(75) Inventors: Shinichi Tanaka, Tokyo (JP); Tatsuya Saito, Tokyo (JP); Yusuke Yokobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/613,622

(22) Filed: Nov. 6, 2009

(65) Prior Publication Data

US 2010/0120237 A1    May 13, 2010

(30) Foreign Application Priority Data

Nov. 10, 2008   (JP) ................................. 2008-287861

(51) Int. Cl.
*H01L 21/20* (2006.01)
*H01L 21/36* (2006.01)

(52) U.S. Cl. ........ 438/507; 438/22; 438/60; 257/E21.09

(58) Field of Classification Search .............. 438/13–48, 438/507; 257/98–103, E21.09, E21.001, 257/E21.121, E33.067, E33.068, E33.074

See application file for complete search history.

(56) References Cited

U.S. PATENT DOCUMENTS

| | | | |
|---|---|---|---|
| 5,798,537 A * | 8/1998 | Nitta | 257/103 |
| 2005/0242365 A1* | 11/2005 | Yoo | 257/103 |
| 2007/0212803 A1* | 9/2007 | Shibata | 438/22 |

FOREIGN PATENT DOCUMENTS

WO    WO 2005/104780 A2    11/2005

* cited by examiner

*Primary Examiner* — Alexander G Ghyka
*Assistant Examiner* — Abdulfattah Mustapha
(74) *Attorney, Agent, or Firm* — Holtz, Holtz, Goodman & Chick, PC

(57) ABSTRACT

A growth substrate is removed from a semiconductor film, and a surface of the semiconductor film exposed by removing the growth substrate is flattened. The semiconductor film along device division lines are partially etched by dry etching to form grooves in a lattice that form streets, not reaching the metal support in the semiconductor film. The surface of the semiconductor film at the bottom of the grooves is flattened. The semiconductor film along the device division lines at the bottom of the grooves are further etched by wet etching to expose the metal support at the bottom of the grooves to finish the streets.

8 Claims, 7 Drawing Sheets

ETCHING RESIDUE

METHOD OF MANUFACTURING SEMICONDUCTOR DEVICES

BACKGROUND OF THE INVENTION

1. Field of the Invention

The present invention relates to a method of manufacturing semiconductor devices and particularly to a technique of forming grooves (streets) separating individual semiconductor devices in a semiconductor film formed over a metal support.

2. Description of the Related Art

Optical semiconductor devices such as light emitting diodes have advanced to be of high efficiency and high output power due to the recent years' progress in technology. However, with the output power having become higher, the amount of heat produced in the optical semiconductor device has increased. A decrease in the reliability of the optical semiconductor device due to, for example, a decrease in efficiency and degradation of the semiconductor film is posing a problem. In order to solve the problem, the semiconductor device is configured such that a growth substrate (i.e., a substrate used for crystal growth) which is relatively low in heat conductivity, is removed from the semiconductor film and that instead, the semiconductor film is supported by metal, which is relatively high in heat conductivity (Japanese Translation of PCT International Application Publication No. 2007-536725). With this structure, the thermal conductivity of the optical semiconductor device is improved, and in addition an improvement in the light extraction efficiency can be expected because of the removal of the growth substrate. That is, light absorption occurring when light passes through the growth substrate and total light reflection occurring at the interface due to the refractive index difference between the semiconductor film and the growth substrate can be reduced.

As to optical semiconductor devices comprising the metal support, before cutting a wafer into individual semiconductor devices by a laser scribing method or the like, grooves hereinafter, referred to as "streets" along multiple division lines and arranged in a lattice are formed in the surface of the wafer to make the metal support exposed at the bottom of the streets, and then the metal support is scribed by a laser scribing method or the like to divide the wafer into chips. The reason why the semiconductor film and the metal support are individually divided is that the effective method to partially remove the semiconductor film is different from the effective method to partially remove metal forming the metal support. For example, in the case of a blue light emitting diode having a semiconductor film made of $Al_xIn_yGa_zN$ ($0 \leq x \leq 1$, $0 \leq y \leq 1$, $0 \leq z \leq 1$, $x+y+z=1$), the streets are formed by partially removing the semiconductor film along device division lines by dry etching such as RIE or wet etching using an alkaline solution such as KOH. Then, in order to cut the metal support partially exposed at the bottom of the streets, a technique such as laser scribing, dicing, or scribing/breaking is used.

As described above, in the conventional manufacturing process of semiconductor devices having a metal support, the streets are formed by partially removing the semiconductor film along device division lines only by dry etching or wet etching. However, when the semiconductor film is etched only by dry etching until the metal support is exposed, plasma in the etching process will be impinges on the exposed metal support surface, and metal particles forming the metal support may scatter into the atmosphere and stick to the semiconductor layer surface. FIGS. 1A and 1B are SEM images showing the state of a semiconductor device where the streets are formed only by dry etching. It is ascertained from these SEM images that metal particles scattered from the metal support are sticking to the sides of the semiconductor film. Metal particles sticking to the side of the semiconductor film, especially at or near the active layer may cause a current at operation to flow through the sticking metal particles, resulting in a leak current or a short. This sticking metal is difficult to remove even by acid treatment or the like, and cannot be removed unless part of the semiconductor film is scraped off. It is practically impossible to control to finish dry etching just when the metal support is exposed so as to prevent the scattering of metal particles because of the flatness of the metal support. Even if the metal support is slightly exposed to plasma, metal sticks to the semiconductor film (FIG. 1B).

In order to avoid the above problem, the method which partially removes the semiconductor film by wet etching can be used. However, according to a study by the inventors of the present invention, it is made clear that performing wet etching on the semiconductor layer (n-type semiconductor layer) exposed by removing the growth substrate cannot completely remove the intended part of the semiconductor film, and that thus etching residue occurs. This is thought to be because, with wet etching using an alkaline solution such as KOH being anisotropic, there remains a crystal plane of the $Al_xIn_yGa_zN$ crystal which is relatively stable to the etchant and slow in etching rate. Further, after the growth substrate is removed by LLO (laser lift-off) and so on, the surface of the semiconductor has laser traces and dislocations produced at crystal growth with various crystal planes or faces being exposed and non-uniformly distributed. Thus, the surface is in a state where etching residue is more likely to occur. FIG. 2 is a SEM image showing a top view of a street formed in the semiconductor film only by wet etching. It is ascertained that etching residues occur along scanning lines of laser irradiation in the LLO process on a street. This is thought to be because the semiconductor film has partially deteriorated due to the laser irradiation in the LLO process, so that the etching rate of the deteriorated portions of the semiconductor film has decreased.

When laser scribing is performed to divide the metal support with etching residues occurring on a street, laser beam will be scattered by the residues of the semiconductor film on the street, and therefore the metal support cannot be cut. Although it is thought to be able to address the problem of etching residue by raising the temperature of the etchant or lengthening the process time in this method, the semiconductor film will be damaged and in addition the process time will become longer, which are not preferable. Further, a resist mask needs to be formed on the semiconductor film to protect areas not intended to be etched when forming the streets in the semiconductor film. However, the resist will be degraded, and in addition side etching under the resist may occur when wet etching is performed under conditions of relatively high reactivity as mentioned above.

SUMMARY OF THE INVENTION

The present invention was made in view of the above facts, and an object thereof is to provide a semiconductor device manufacturing method which can solve the problems of scattering of metal particles and the etching residues as described above that occur in the process of forming the streets in the semiconductor film having a metal support.

According to the present invention, there is provided a method of manufacturing semiconductor devices which includes a support having a metal surface and a semiconductor film formed on the metal surface of the support. The method comprises a semiconductor film growing step of epitaxially growing the semiconductor film over a growth substrate; a support forming step of forming the support over a surface of the semiconductor film such that the metal surface is adjacent to the surface of the semiconductor film; a growth substrate removing step of removing the growth substrate from the semiconductor film; a first flattening step of flattening a surface of the semiconductor film exposed by removing the growth substrate; a first etching step of etching parts of the semiconductor film along device division lines at the surface flattened at the first flattening step by dry etching to form grooves in a lattice and not reaching the support in the semiconductor film; a second flattening step of flattening a surface of the semiconductor film at the bottom of the grooves; a second etching step of further etching parts of the semiconductor film along the device division lines at the bottom of the grooves by wet etching to expose the metal surface of the support at the bottom of the grooves; and an device separating step of forming division grooves in the support exposed at the bottom of the grooves to separate the semiconductor devices into chips.

According to the method of manufacturing semiconductor devices of the present invention, in order to form the streets along device division lines in the semiconductor film laid over the metal support, the dry etching and the wet etching are used in combination. At the stage of etching the semiconductor film until the metal support is exposed, the wet etching is used, and hence the problem can be avoided that the metal support is exposed to plasma and that thus metal particles sputtered from the constituting the metal support scatter to stick to the semiconductor film, resulting in a leak current or a short. Further, because the flattening process is performed on the semiconductor film prior to each of the etchings, so that the surface state of the semiconductor film becomes uniform, the occurrence of etching residue on the streets after the wet etching can be prevented. Yet further, by using the dry etching (RIE: Reactive ion etching) in the first half of the street forming process, the process time can be reduced.

DETAILED DESCRIPTION OF THE INVENTION

Figure 1A:
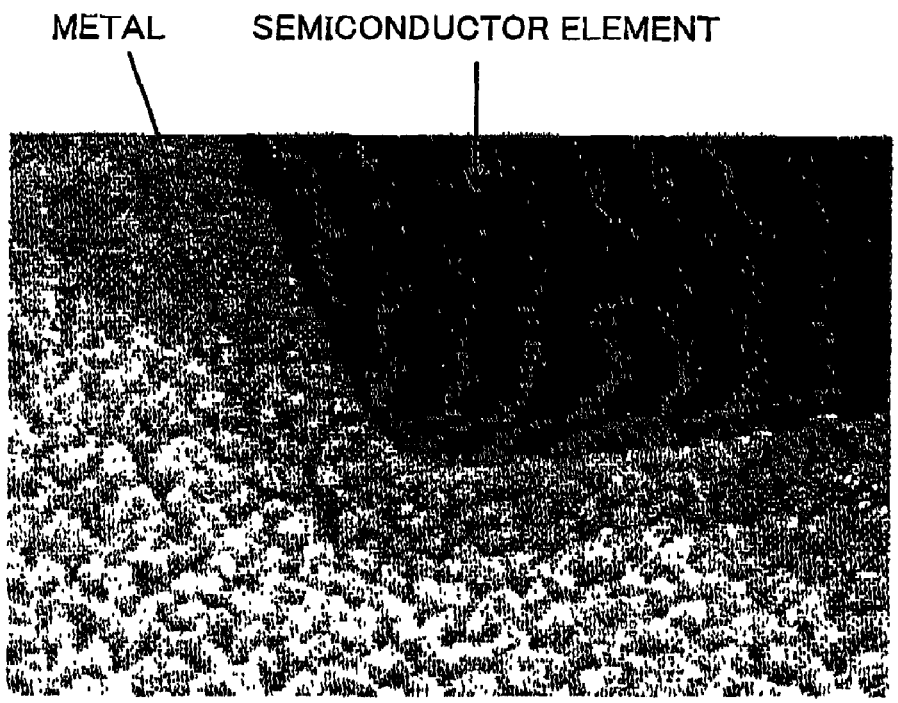
FIGS. 1A and 1B are SEM images of the surface of a semiconductor device where streets are formed only by dry etching.
Figure 1B:
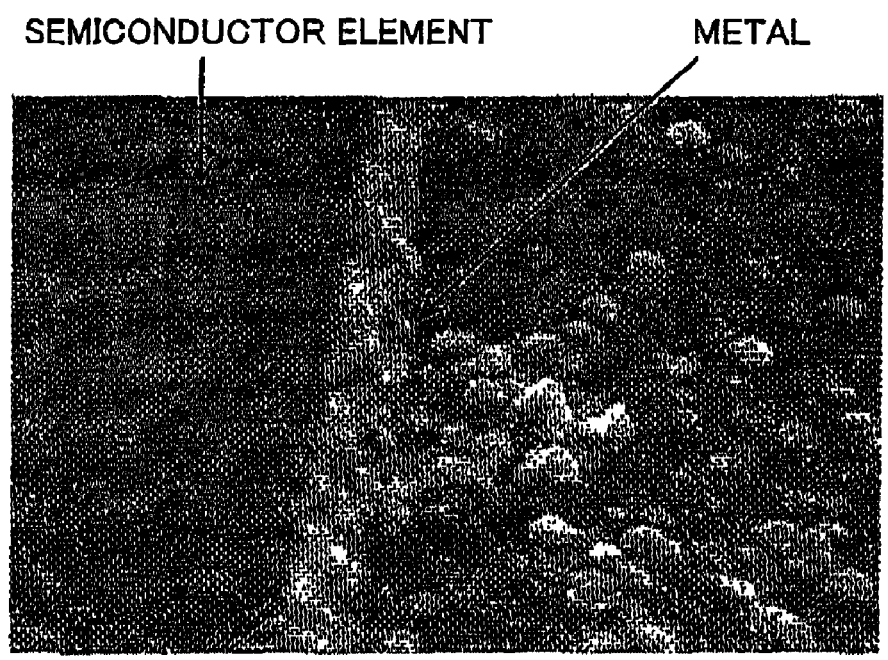
Figure 2:
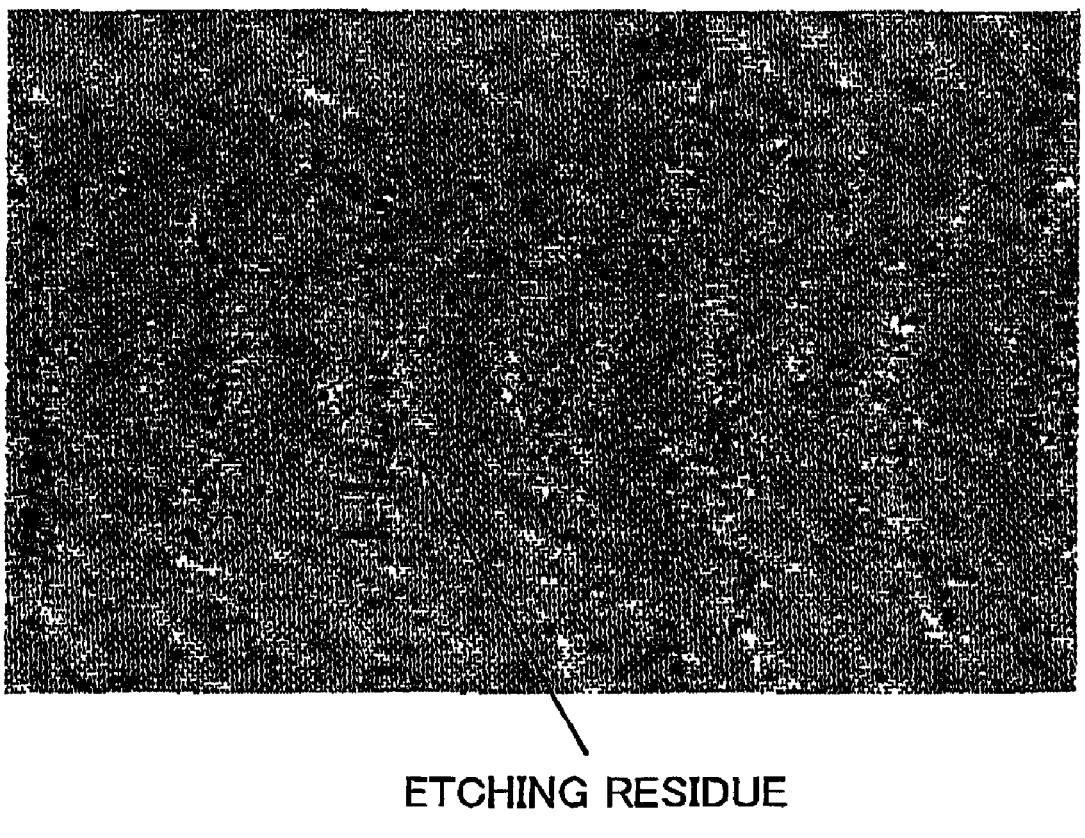
FIG. 2 is a SEM image showing the surface of a street formed only by wet etching.

An embodiment of the present invention will be described below with reference to the drawings. The same reference numerals are used to denote substantially the same or equivalent constituents or parts throughout the figures cited below.

Figure 3A:
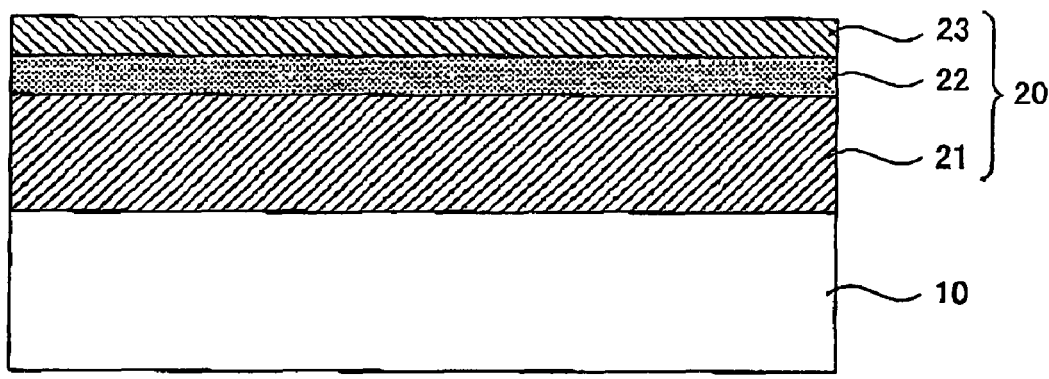
FIGS. 3A to 3I are cross-sectional views showing a method of manufacturing semiconductor devices according to an embodiment of the present invention.
Figure 3B:
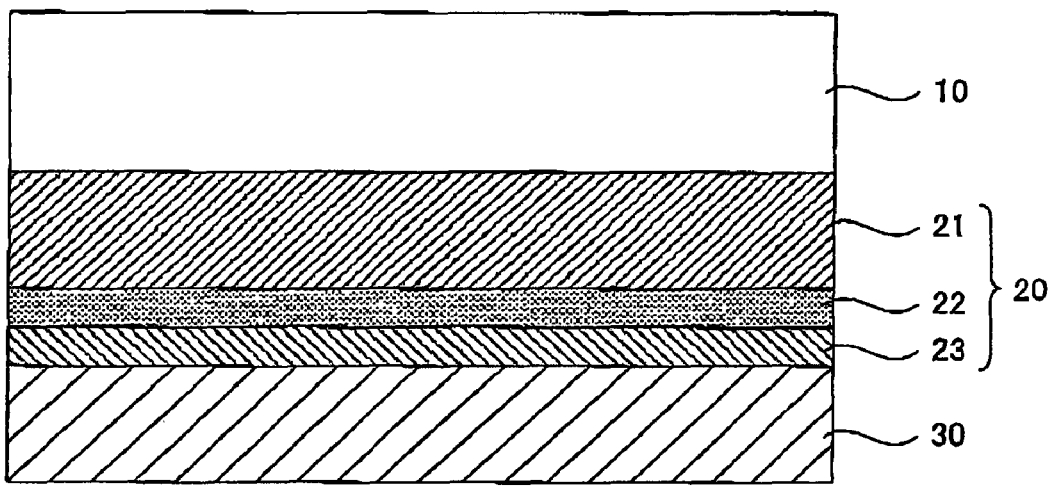
Figure 3C:
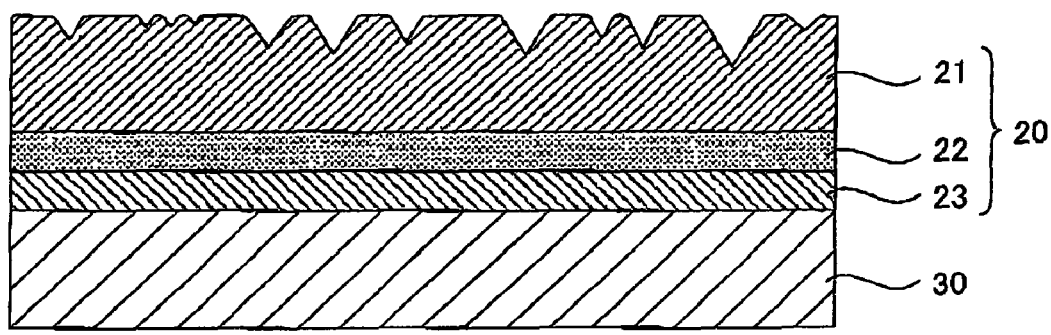
Figure 3D:
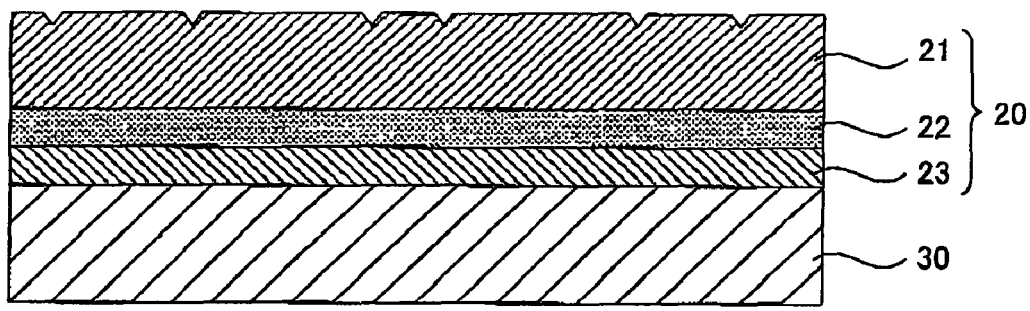
Figure 3E:
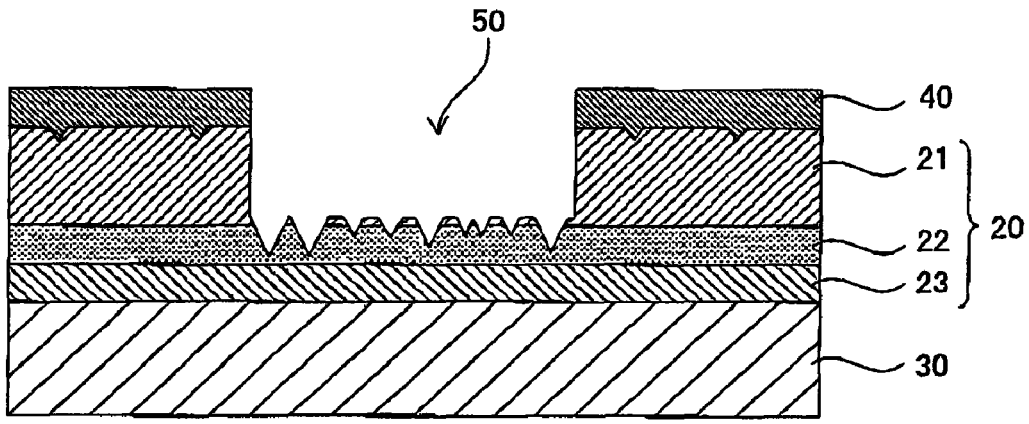
Figure 3F:
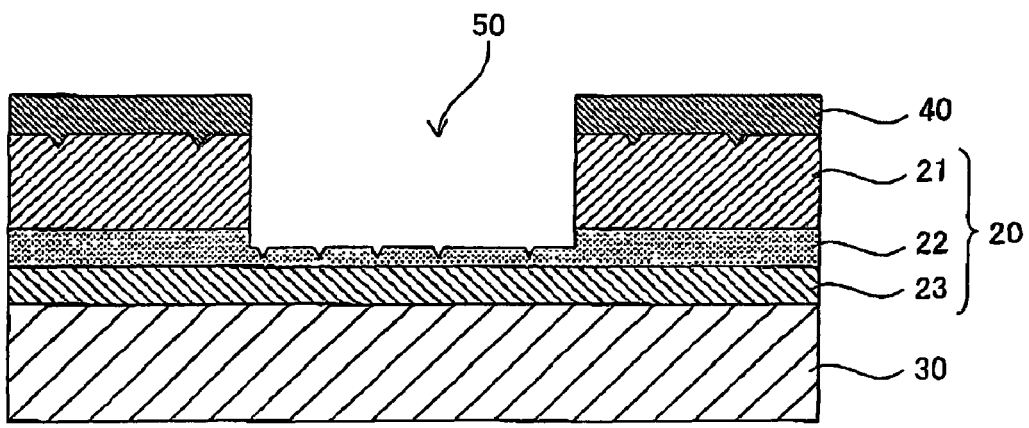
Figure 3G:
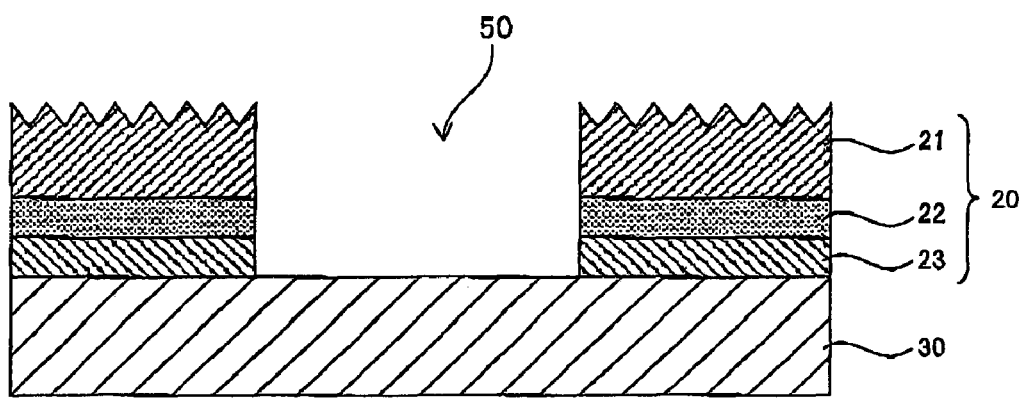
Figure 3H:
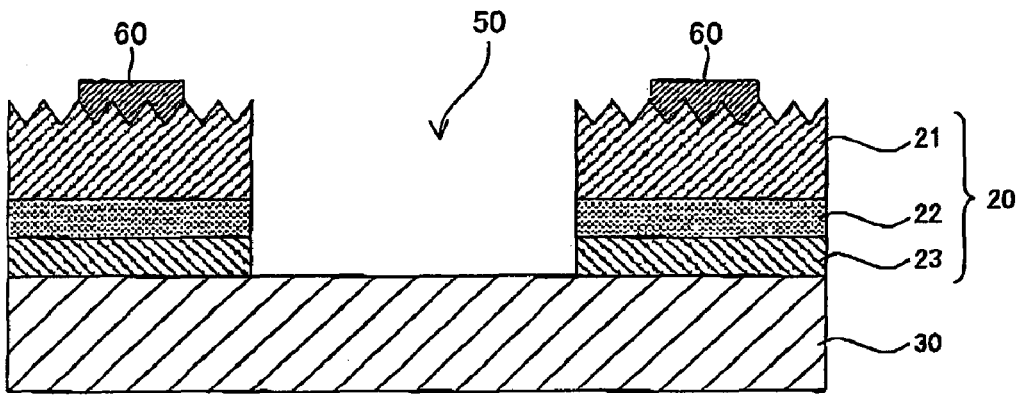
Figure 3I:
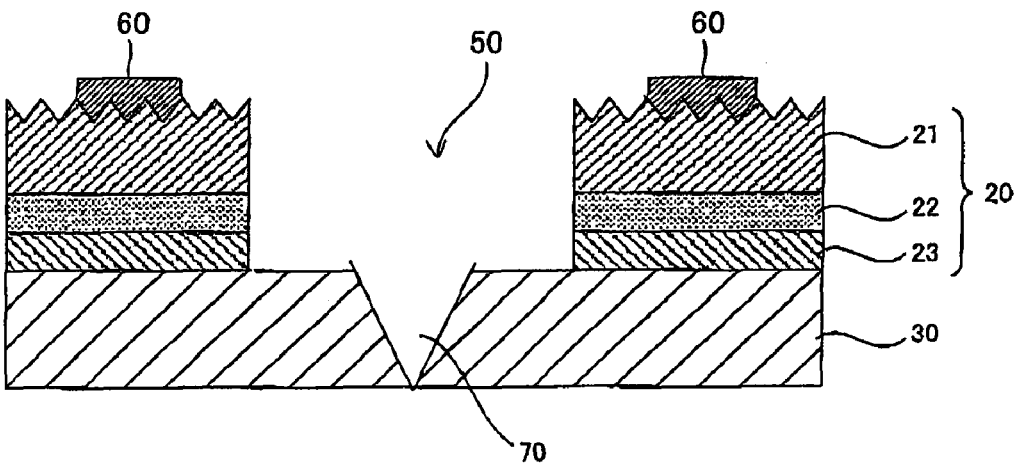
Figure 4:
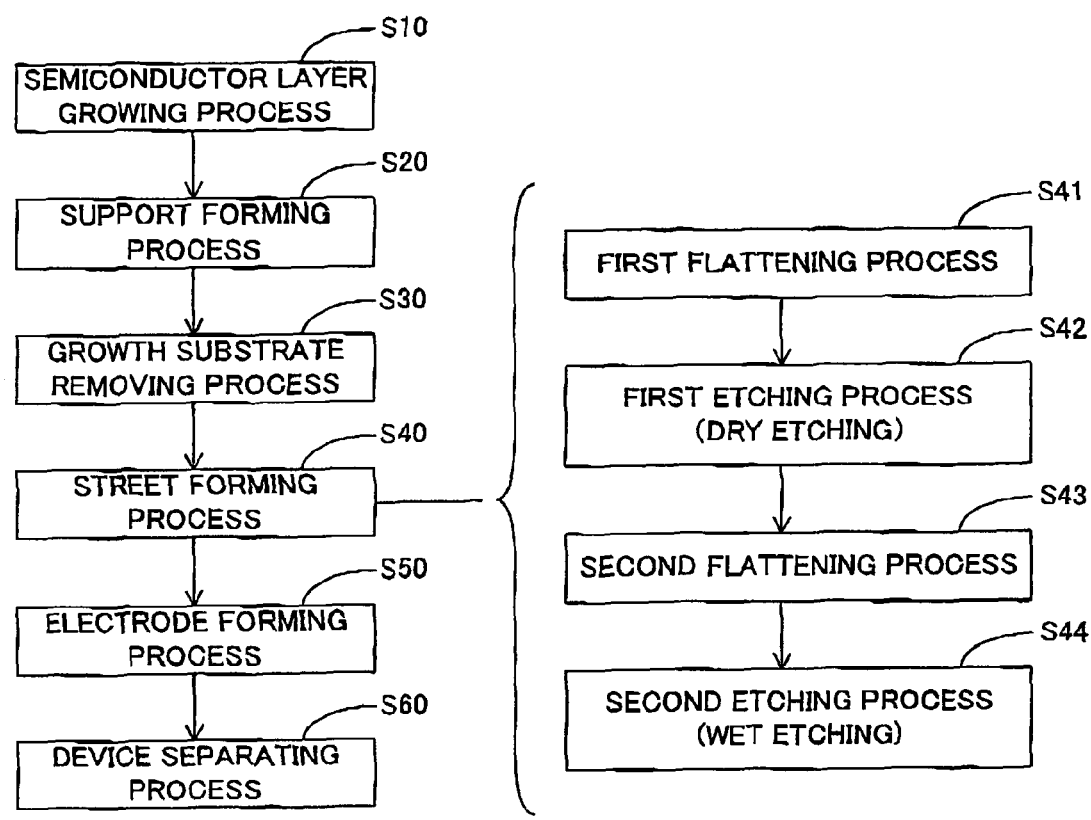
FIG. 4 is a process flow diagram showing the method of manufacturing semiconductor devices that is the embodiment of the present invention.

FIGS. 3A to 3I are cross-sectional views of optical semiconductor devices in process steps respectively of the manufacturing process according to the embodiment of the present invention. FIG. 4 is a process flow diagram showing a method of manufacturing an optical semiconductor device that is the embodiment of the present invention.

(Semiconductor Layer Growing Process, Step S10)

A substrate used for crystal growth (hereinafter, referred to as growth substrate) is prepared. In the present embodiment, a C-plane sapphire substrate 10 is used on which a semiconductor film made of $Al_xIn_yGa_zN$ ($0 \leq x \leq 1$, $0 \leq y \leq 1$, $0 \leq z \leq 1$, $x+y+z=1$) can be formed by an MOCVD method (metal organic chemical vapor deposition method). The layers constituting a semiconductor film 20 are laid one over another on the sapphire substrate 10 along a C-axis direction of a wurtzite-type crystal structure by the MOCVD method.

First, thermal cleaning is performed on the sapphire substrate 10. Specifically, the sapphire substrate 10 is transferred into an MOCVD apparatus and heated in a hydrogen atmosphere at about 1,000° C. for about 10 minutes. Subsequently, the substrate temperature (growth temperature) is set at 500° C., and TMG (trimethylgallium) at a flow rate of 10.4 μmol/min and $NH_3$ at a flow rate of 3.3 LM are supplied for about minutes, thereby forming a low-temperature grown buffer layer constituted by a GaN layer (not shown). Then, the substrate temperature is raised to 1,000° C. and maintained for about 30 seconds to crystallize the low-temperature grown buffer layer.

Subsequently, with the substrate temperature kept at 1,000° C., TMG at a flow rate of 45 μmol/min and $NH_3$ at a flow rate of 4.4 LM are supplied for about 20 minutes, thereby forming a GaN base layer (not shown) of about 1 μm thickness. Then, at a substrate temperature of 1,000° C., TMG at a flow rate of 45 μmol/min, $NH_3$ at a flow rate of 4.4 LM, and $SiH_4$ as dopant gas at a flow rate of $2.7 \times 10^{-9}$ mol/min are supplied for about 40 minutes, thereby forming an n-GaN layer 21 of about 2 μm thickness.

Subsequently, an active layer 22 is formed on the n-GaN layer 21. In the present embodiment, a multi-quantum well structure of InGaN/GaN is applied to the active layer 22. That is, with InGaN/GaN as a period, five periods of growth is performed. Specifically, at a substrate temperature of 700° C., TMG at a flow rate of 3.6 μmol/min, TMI (trimethylindium) at a flow rate of 10 μmol/min, and $NH_3$ at a flow rate of 4.4 LM are supplied for about 33 seconds, thereby forming an InGaN well layer of about 2.2 nm thickness. Subsequently, TMG at a flow rate of 3.6 μmol/min and $NH_3$ at a flow rate of 4.4 LM are supplied for about 320 seconds, thereby forming a GaN barrier layer of about 15 nm thickness. By repeating this process five periods, the active layer 22 is formed.

Then, the substrate temperature is raised to 870° C., and TMG at a flow rate of 8.1 μmol/min, TMA (trimethylaluminum) at a flow rate of 7.5 μmol/min, $NH_3$ at a flow rate of 4.4 LM, and CP2Mg (bis-cyclopentadienyl Mg) as a dopant at a flow rate of $2.9 \times 10^{-7}$ μmol/min are supplied for about 5 minutes, thereby forming the p-type AlGaN clad layer (not shown) of about 40 nm thickness. Subsequently, with the substrate temperature maintained, TMG at a flow rate of 18 μmol/min, $NH_3$ at a flow rate of 4.4 LM, and CP2Mg as a dopant at a flow rate of $2.9 \times 10^{-7}$ μmol/min are supplied for about 7 minutes, thereby forming a p-GaN layer 23 of about 150 nm thickness (FIG. 3A).

(Metal Support Forming Process, Step S20)

Then, a metal support 30 is formed on the p-GaN layer 23. The metal support 30, supporting the semiconductor film 20, serves to dissipate heat generated in the semiconductor film 20 at operation. In the present embodiment, a copper film is used as the metal support, which is relatively high in thermal conductivity. The metal support 30 constituted by the copper film can be formed by an electrolytic plating method. Specifically, the layered structure having the semiconductor film 20 layered on the sapphire substrate is soaked in a copper cyanide- or copper sulfate-based plating bath, thereby growing a plated copper film of about 80 μm thickness on the p-GaN layer 23 to form the metal support 30. At this time, an organic material-based smooting agent and brightener may be used as an additive in order to adjust mechanical properties such as rigidity and flatness of the plated copper film (FIG. 3B). In this case, an appropriate metal film may be formed in order to improve the ohmic characteristic and reflectance, and so on before forming the plated copper film.

(Growth Substrate Removing Process, Step S30)

Figure 5:
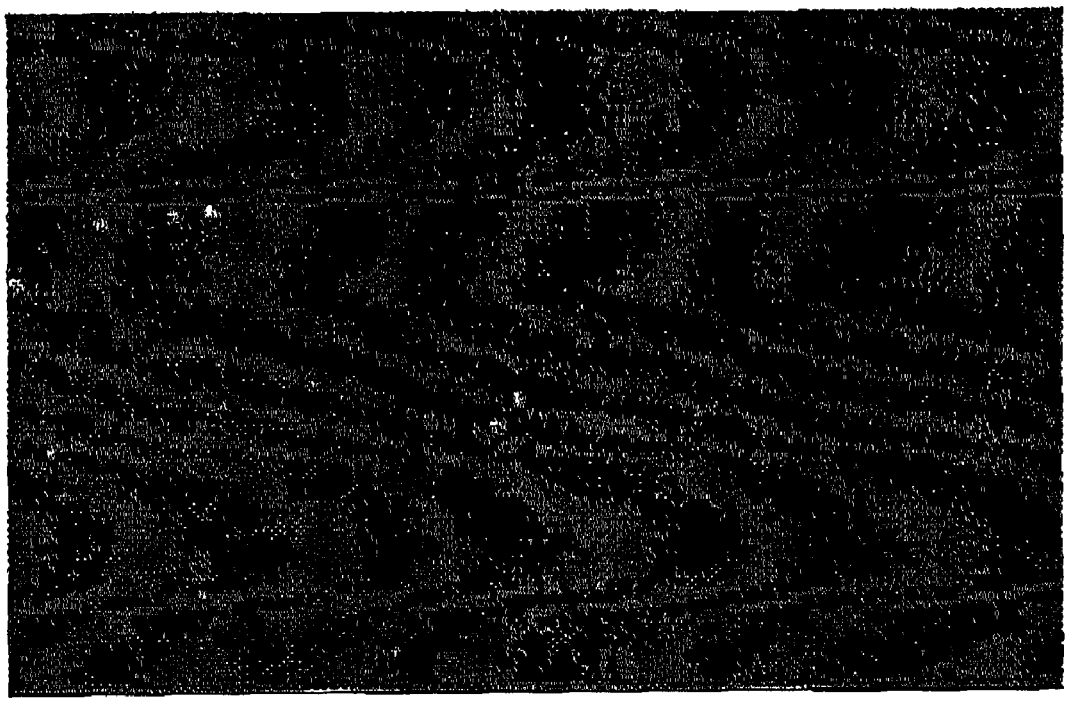
FIG. 5 is a SEM image showing a semiconductor film surface exposed by removing a growth substrate by laser lift-off.

Then, the sapphire substrate 10 is removed from the semiconductor film 20. A widely known technique such as the LLO (laser lift-off) method can be used to remove the sapphire substrate 10. In the LLO method, the irradiated laser decomposes a GaN layer formed on the sapphire substrate 10 into metal Ga and $N_2$ gas. Hence, the decomposition occurs in the n-GaN layer 21 or the underlying GaN layer, and on the surface after the sapphire substrate 10 is removed, the n-GaN layer 21 or the underlying GaN layer appears. On the surface of the n-GaN layer 21 having appeared after the sapphire substrate 10 is removed, as shown in FIG. 5, there exist laser traces formed along laser scanning lines and a lot of pits due to threading dislocations generated at crystal growth, so that the surface is in a state of having depressions/protrusions or asperities about 40 to 50 nm deep (FIG. 3C). Note that the method of removing the growth substrate may be to polish the growth substrate to remove it, not being limited to separating the growth substrate from the semiconductor film by the LLO method.

(Street Forming Process, Step S40)

A street forming process is one which partially exposes the metal support 30 by removing part of the semiconductor film 20 along device division lines prior to a laser scribing process of separating it into semiconductor devices. The streets are constituted by a plurality of grooves formed through the semiconductor film 20 to the metal support 30 and arranged in a lattice on the surface of the wafer, and partition the semiconductor film 20 into a plurality of rectangular areas. The street forming process includes; a first etching process (step S42) which forms grooves that extend from the surface of the semiconductor film 20 by dry etching (RIE: Reactive ion etching) such that the grooves have a depth as not to reach the metal support 30, and a second etching process (step S44) which further etches the grooves formed at the first etching process by wet etching to partially expose the metal support 30, thus finishing the street. Further, first and second flattening processes (steps S41, S43) to flatten the semiconductor film surface by etching are performed prior to the first and second etching processes respectively. The details of the street forming process will be described below.

(First Flattening Process, Step S41)

The wafer having the metal support 30 formed thereon is transferred into an RIE apparatus, and physical dry etching using plasma of rare gas such as Ar is performed on the semiconductor film 20 to flatten the surface of the n-GaN layer 21 exposed by removing the sapphire substrate 10. As mentioned above, in the surface of the n-GaN layer 21 after the growth substrate 10 is removed by the LLO, there are formed laser traces and multiple pits due to threading dislocations, so that the surface is in a state of having depressions/protrusions about 40 to 50 nm deep height. That is, on the surface of the n-GaN layer 21 after the LLO, various crystal planes or facets are non-uniformly distributed, and the surface is in a state where crystal planes stable to chemical etching and unstable crystal planes are non-uniformly mixed. With this surface state, etching residue is likely to occur in the subsequent dry etching process. Accordingly, dry etching with Ar plasma is performed on the semiconductor film 20, thereby flattening the surface of the n-GaN layer 21 so that crystal faces for which chemical etching easily advances are uniformly distributed, thereby preventing etching residues from occurring. The conditions for the Ar etching are a process pressure of 1.0 Pa, Ant-Power (or Antenna power) of 200 W, Bias-Power of 50 W, an Ar flow rate of 50 sccm, and a process time of 840 seconds. Under these conditions, the etching rate of the semiconductor film 20 is close to zero, and with the thickness of the semiconductor film 20 being hardly reduced, the depression/protrusion surface formed by laser traces, pits, and the like formed In the surface of the n-GaN layer 21 is flattened (FIG. 3D).

(Dry Etching Process (First Etching Process), Step S42)

Next, the wafer is taken out of the RIE apparatus, and a resist mask 40 having openings corresponding to street-to-be-formed areas or street forming areas is formed on the flattened surface of the n-GaN layer 21 using photolithography or the like. Then, the wafer is transferred into the RIE apparatus again, and grooves 50 constituting the streets and not reaching the metal support 30 are formed in the semiconductor film 20 by performing dry etching with $Cl_2$ plasma on the semiconductor film 20. In this process, with using $Cl_2$ plasma, there occurs RIE (reactive ion etching) where sputtering with ions and the chemical reaction of etching gas take place simultaneously, and as compared with the case of forming the streets only by wet etching, the process time can be greatly reduced. Further, because the dry etching is finished before grooves 50 would otherwise reach the metal support, the metal support 30 is not exposed to and sputtered by plasma. Accordingly, scattering of metal particles into the process atmosphere can be avoided.

The thickness of the semiconductor film 20 remaining on the street-to-be-formed areas after the $Cl_2$ dry etching is preferably about 0.3 μm to 3 μm. If the remaining film of the semiconductor film 20 is thinner (0.3 μm or less), the metal support 30 may be exposed by Ar plasma etching performed at the subsequent second flattening process, and metal particles may scatter into the plasma atmosphere to stick to the semiconductor film 20. On the other hand, if the remaining film of the semiconductor film 20 is thicker (3 μm or greater), the process time in a subsequent wet etching process (the second etching process) will increase, and in addition in this wet etching, a crystal plane slow in etching rate may appear, resulting in the occurrence of etching residue. Accordingly, in this embodiment, the thickness of the semiconductor film 20 remaining on the street-to-be-formed areas after the $Cl_2$ dry etching (first etching process) is set at about 1 μm so that the metal support 30 is not exposed to plasma in the subsequent second flattening process using Ar plasma and that portions of the semiconductor film 20 on the street-to-be-formed areas can be completely removed in a relatively short time without etching residue occurring in the wet etching process (second etching process), and further taking into account the forming of six-sided pyramid-shaped protrusions (described later) of about 1 to 3 μm height in the surface of the n-GaN layer 21 to improve the light extraction efficiency in the wet etching process. The specific processing conditions are a process pressure of 0.2 Pa, Ant-Power of 200 W, Bias-Power of 50 W, a $Cl_2$ flow rate of 20 sccm, and a process time of 1,428 seconds (FIG. 3E).

(Second Flattening Process, Step S43)

Dry etching using $Cl_2$ plasma is extremely higher in etching rate than dry etching using Ar plasma and is suitable for removal of the semiconductor film. However, because dry etching with $Cl_2$ plasma includes chemical etching, a crystal plane relatively stable and slow in etching rate partially appears as with anisotropic wet etching, and thus the bottom surface of the groove 50 is in a state of having a lot of depressions/protrusions about several hundred nm deep. If wet etching is performed in the subsequent second etching process with a lot of depressions/protrusions formed in the bottom surface of the groove 50, the possibility of etching residue occurring is high. Accordingly, physical dry etching using Ar plasma is performed subsequent to the $Cl_2$ plasma dry etching again to flatten the bottom surface of the groove 50, thereby preventing the occurrence of etching residue. The specific processing conditions are a process pressure of 1.0 Pa, Ant-Power of 200 W, Bias-Power of 50 W, an Ar flow rate of 50 sccm, and a process time of 840 seconds (FIG. 3F).

Note that if the $Cl_2$ dry etching (first etching process) is performed without flattening by the previous first flattening process, depressions/protrusions in the surface of the semiconductor film 20 after the etching will be further deepened, and that thus it will become difficult to flatten the surface of the semiconductor film 20 in the second flattening process. Therefore, in order to finally form the streets without etching residue occurring, it is effective to flatten the surface of the semiconductor film 20 in the first flattening process prior to the $Cl_2$ dry etching.

(Wet Etching Process (Second Etching Process), Step S44)

Next, by performing wet etching on the semiconductor film 20 exposed at the bottom of the grooves 50, the semiconductor film 20 of about 1 μm thickness remaining on the street-to-be-formed areas is removed. By this means, the metal support 30 is exposed at the bottom of the grooves 50 to finish streets partitioning the wafer into individual semiconductor devices. Specifically, 5M-KOH is used as the etchant with the process temperature being 90° C. and the process time being 120 min.

As such, the metal support 30 is exposed by wet etching to finish the streets, and hence the problem can be avoided that when etching, metal particles scatter to stick to the semiconductor film, resulting in a leak current or a short. Further, in the previous first etching process, the thickness of the semiconductor film 20 on the street-to-be-formed areas is set at about 1 μm, and in the previous second flattening process, the semiconductor film surface at the bottom of the grooves 50 gets flattened. Hence, in this wet etching process, the streets can be formed without etching residue occurring on the streets.

Further, in this wet etching process, six-sided pyramid-shaped (or hexagonal pyramid-shaped) protrusions can be formed in the surface of the n-GaN layer 21 to improve the light extraction efficiency, with finishing the streets. By performing depression/protrusion processing on the light emitting surface of an optical semiconductor device, total reflection of light, which is caused by light incident at an critical angle or greater, at the interface between the optical semiconductor device and encapsulation resin can be reduced, thus improving the light extraction efficiency. As to $Al_xIn_yGa_zN$ ($0 \leq x \leq 1$, $0 \leq y \leq 1$, $0 \leq z \leq 1$, $x+y+z=1$) grown on a usual growth substrate (e.g., C-plane sapphire, C-plane GaN, SiC, etc.), the surface of the n-GaN layer 21 that appears by removing the growth substrate is constituted by the C-plane (N face). Protrusions shaped like a hexagonal pyramid, which derives from a wurtzite-type crystal structure, can be formed by performing anisotropic wet etching. Thus, by removing the resist mask 40 formed on the surface of the n-GaN layer 21 to expose the n-GaN layer 21 before the second wet etching process, forming the streets and forming hexagonal pyramid-shaped protrusions to improve the light extraction efficiency can be performed simultaneously in the second wet etching process. In the first etching process, as mentioned above, the grooves 50 are preferably formed such that the remaining film of the semiconductor film 20 is about 1 μm thick, so that the heights of the hexagonal pyramid-shaped protrusions are 1 to 3 μm when the streets are finished (FIG. 3G).

(Electrode Forming Process, Step S50)

Next, on the surface of the n-GaN layer 21 where six-sided pyramid-shaped protrusions are formed, an electrode pad 60 is formed by, e.g., a lift-off method. Specifically, a resist mask having the opposite or reverse of an electrode pattern is formed on the n-GaN layer 21, and a metal film of TiAl or the like is deposited thereon by a vacuum evaporation method. Then, by removing the unnecessary portion of the metal film together with the resist mask, the electrode pad 60 having a desired pattern is formed. Then, in order to form ohmic contact between the electrode and the semiconductor film, rapid thermal annealing (RTA) at 500° C. for 20 seconds is performed. Note that after a transparent conductive film of ITO (indium tin oxide) is formed almost entirely over the surface of the n-GaN layer 21, an electrode pad of TiAl or the like may be formed on the ITO film. Although in this embodiment an electrode pad is formed after the streets are formed, the streets may be formed after an electrode pad is formed. In this case, a resist mask to protect the electrode pad in the above various etching processes performed in the street forming process is necessary (FIG. 3H).

(Element Separating Process, Step S60)

Then, by cutting or separating the partially exposed metal support 30 along the streets by a laser scribing method and so on, separation process into the semiconductor devices is performed. In laser scribing method, the metal support 30 is irradiated with high-power laser beam, thereby locally evaporating the metal support 30 to form division grooves. In this embodiment, a YAG laser is used with a laser power of 2 W, an oscillation frequency of 50 KHz, and a scanning speed of 35 mm/sec. By scanning the laser along the streets formed in a lattice under these conditions, V-shaped division grooves 70 are formed in the metal support 30, and the semiconductor devices are separated in a rectangular shape (FIG. 3I). By undergoing the above steps, the semiconductor devices are manufactured.

As apparent from the above description, according to the method of manufacturing a semiconductor device of the present invention, in order to form the streets along the division lines in the semiconductor film having the metal support, the dry etching (first etching process) and the wet etching (second etching process) are used in combination. That is, the wet etching is used at the stage of forming the streets in such a way that the metal support is exposed. Therefore, the problem can be avoided that the metal support is exposed to plasma, and that metal particles forming the metal support scatter to stick to the semiconductor film. Further, since the dry etching is performed prior to the wet etching, the thickness of the semiconductor film removed by the wet etching is sufficiently small, and in addition because the flattening process (second flattening process) is performed on the semiconductor film after the dry etching, the occurrence of etching residue can be prevented in the wet etching process. Yet further, by applying RIE using $Cl_2$ plasma to the first half of the street forming process, the process time can be greatly reduced as compared with the case of forming the streets only by wet etching. Still further, because the flattening process (first flattening process) is performed on the semiconductor film before the dry etching as well, depressions/protrusions occurring in the surface of the semiconductor film after the dry etching (RIE) can be diminished in depth/height. Hence, in the flattening process (second flattening process) before the wet etching, the semiconductor film can be easily flattened.

The method of manufacturing semiconductor devices of the present invention has been described by way of an embodiment. The method of manufacturing semiconductor devices of the invention is a method useful for semiconductor devices with a support at least whose surface adjacent to the semiconductor film is made of metal, not being limited to ones with a support entirely made of metal as shown in the embodiment.

In the case of forming semiconductor devices with a support whose surface in contact with the semiconductor film is made of metal, in the support forming process, by sticking a support substrate of, e.g., Si or the like and the semiconductor film together via an appropriate metal film such as AuSn, a support attached to a surface of the semiconductor film can be formed. According to the method of manufacturing semiconductor devices of the present invention, the streets can be formed even in semiconductor devices of this structure without the sputtering of metal.

The invention has been described with reference to the preferred embodiment thereof. It should be understood that those skilled in the art may think of a variety of modifications and alterations to the embodiment. It is contemplated that the scope of the appended claims includes all such modifications and alterations.

This application is based on Japanese Patent Application No. 2008-287861, which is herein incorporated by reference.

What is claimed is:

1. A method of manufacturing semiconductor devices which includes a support having a metal surface and a semiconductor film formed on said metal surface of said support, comprising:
    a semiconductor film growing step of epitaxially growing said semiconductor film on a growth substrate;
    a support forming step of forming said support on a surface of said semiconductor film such that said metal surface is attached to said surface of said semiconductor film;
    a growth substrate removing step of removing said growth substrate from said semiconductor film;
    a first flattening step of flattening a surface of said semiconductor film exposed by removing said growth substrate;
    a first etching step of partially etching said semiconductor film along device division lines at the surface flattened at said first flattening step by dry etching to form grooves in said semiconductor film, said grooves having a lattice form and not reaching said support;
    a second flattening step of flattening a surface of said semiconductor film at the bottom of said grooves;
    a second etching step of further partially etching said semiconductor film along said device division lines at the bottom of said grooves by wet etching to expose said metal surface of said support at the bottom of said grooves; and
    a groove forming step of forming division grooves in said support exposed at the bottom of said grooves.

2. A method according to claim 1, wherein said semiconductor film is comprised of group-III nitride semiconductor layers of a wurtzite structure and is formed along a C-axis direction of the crystal structure on said growth substrate.

3. A method according to claim 2, wherein said semiconductor film comprises an n-type semiconductor layer, an active layer, and a p-type semiconductor layer that are sequentially laid one over another on said growth substrate and each made of $Al_xIn_yGa_zN$, where $0 \leq x \leq 1$, $0 \leq y \leq 1$, $0 \leq z \leq 1$, and $x+y+z=1$.

4. A method according to claim 3, wherein said second etching step includes a process of forming hexagonal pyramid-shaped protrusions deriving from the crystal structure of said semiconductor film in a surface thereof.

5. A method according to claim 1, wherein the thickness of said semiconductor film remaining on areas where said grooves are formed after said first etching step is 0.3 to 3 μm.

6. A method according to claim 1, wherein the flattening of said semiconductor film at said first and second flattening steps is performed by plasma dry etching using rare gas.

7. A method according to claim 1, wherein said first etching step includes a reactive ion etching process.

8. A method according to claim 1, wherein said growth substrate removing step is performed by a laser lift-off method.

* * * * *